United States Patent [19]

Platzoeder et al.

[11] 3,837,000

[45] Sept. 17, 1974

[54] SEMICONDUCTOR DEVICE HAVING A SILVER LAYER IN PRESSURE CONTACT WITH THE DEVICE SURFACE

[75] Inventors: Karl Platzoeder; Heinz Martin; Reimer Emeis, all of Munich, Germany

[73] Assignee: Siemens Aktiengesellschaft, Berlin and Munich, Germany

[22] Filed: Nov. 7, 1973

[21] Appl. No.: 413,650

[30] Foreign Application Priority Data

Nov. 21, 1972 Germany ............................ 2257078

[52] U.S. Cl. ........................ 357/65, 357/67, 357/71, 357/79, 357/81, 29/588

[51] Int. Cl. ............................ H01l 3/00, H01l 5/00

[58] Field of Search ............ 317/234, 1, 3, 4, 5, 5.3, 317/6; 29/588

[56] References Cited

UNITED STATES PATENTS

| | | | |
|---|---|---|---|
| 3,221,219 | 11/1965 | Emeis et al. | 317/234 |
| 3,447,236 | 6/1969 | Hatcher | 317/234 M |
| 3,463,976 | 8/1969 | Steinmetz | 317/235 |
| 3,492,545 | 1/1970 | Meyerhoff | 317/234 |
| 3,562,605 | 2/1971 | Ferree | 317/234 |

*Primary Examiner*—Andrew J. James

*Attorney, Agent, or Firm*—Hill, Gross, Simpson, Van Santen, Steadman, Chiara & Simpson

[57] ABSTRACT

A semiconductor component having at least an outer diffusion doped zone and including a silver-plated aluminum electrode thereon and a supply electrode in pressure contact with said silver-plated aluminum electrode. The supply electrode is composed of a metal, such as aluminum or copper, which has a coefficent of thermal expansion different from that of the semiconductor body and has a contacting surface defined by a layer composed of a silver material, which layer is characterized by a thickness of at least 50$\mu$ and a surface roughness ranging between 2 to 10$\mu$.

11 Claims, 5 Drawing Figures

A SEMICONDUCTOR DEVICE HAVING A SILVER LAYER IN PRESSURE CONTACT WITH THE DEVICE SURFACE

BACKGROUND OF THE INVENTION

1. Field of the Invention

The invention relates to a semiconductor component having a semiconductor body with at least an outer diffusion doped zone and a vaporized electrode thereon in pressure contact with a supply electrode.

2. Prior Art

Semiconductor components having a semiconductor body with at least an outer diffusion doped zone and a silver-plated aluminum electrode vaporized thereon are known. However, difficulties are encountered when a contact between such extremely thin vapor-deposited silver-plated aluminum electrodes and other component elements is required. Either the electrode or even the semiconductor body itself tends to be damaged or destroyed during the component operation by mechanical stresses which occur parallel to the main surface of the semiconductor body. The prior art has suggested that such stresses might be avoided by constructing a supply electrode which is positioned on the electrode from a material having a coefficient of thermal expansion which is a least similar to that of the semiconductor body. Such a material is, for example, tungsten or molybdenum. However, these metals are much poorer thermal conductors than, for example, silver, copper or aluminum. Further, metals having a coefficient of thermal expansion similar to semiconductor bodies are expensive and are relatively hard, rendering them difficult to process mechanically. Mechanical processing of at least the surfaces arranged on the electrode is indispensable, particularly with pressure contacts since such contacts must lie uniformly over the entire surface of the electrode on the semiconductor body.

A pressure contact for semiconductor components is known wherein a silver foil is positioned between a supply electrode composed of copper and the electrode of the semiconductor body. However, there is no suggestion how to construct such electrodes or from what type of materials.

SUMMARY OF THE INVENTION

The invention provides a pressure contact for semiconductor components having a semiconductor body which has a least one diffusion doped outer zone and carries an electrode thereon composed of vaporized-on silver-plated aluminum film wherein a supply electrode is composed of a metal having a coefficient of thermal expansion different from that of the semiconductor body and which has a pressure-contacting surface in pressure contact with the electrode of the semiconductor and which does not coalesce under any operating conditions.

It is a novel feature of the invention to provide a supply electrode having a coefficient of thermal expansion different from that of a semiconductor body for pressure contact with a thin electrode on the semiconductor body and which has a pressure contacting surface defined by a layer composed of a silver material, such as relatively pure silver or a silver alloy, having a thickness of at least 50$\mu$ and a surface roughness ranging between 2 to 10$\mu$.

In certain embodiments of the invention, the pressure-contact surface of the supply electrode is permanently attached to the supply electrode, as by rolling, soldering or spraying. In other embodiments, the pressure-contact surface comprises a foil loosely positioned between the semiconductor electrode and the supply electrode. In such embodiments, the foil is preferably formed as a cap-like member which embraces at least a portion of the supply electrode periphery.

DESCRIPTION OF THE PREFERRED EMBODIMENTS

The invention provides a pressure contact for a semiconductor component having a thin electrode on the semiconductor body comprised of a supply electrode in pressure contact with the thin electrode and being composed of a metal having a coefficient of thermal expansion different from that of the semiconductor body and which does not coalesce under any semiconductor component operating conditions. The pressure contacting surface of the supply electrode is defined by a layer composed of a silver material (i.e. substantially pure silver or a silver alloy) and which has a thickness of a least 50$\mu$ and up to 200$\mu$ and a surface roughness that ranges between about 2 to 10$\mu$.

Figure 1:
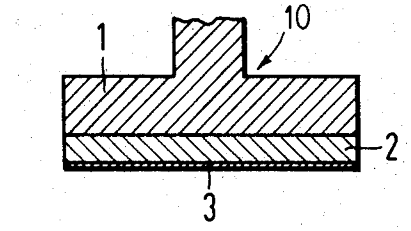
(PRIOR ART) Fig. 1
FIG. 1 is an elevated cross-sectional partial view of a prior art supply electrode.

FIG. 1 illustrates a portion of a supply electrode 10 constructed in accordance with the prior art. Generally, the supply electrode 10 is comprised of three parts, i.e., part 1 composed of a material which is an electrically and thermally good conductor, such as for example, copper. A disc 2 is joined to part 1 and is composed of a metal which has a coefficient of thermal expansion approximately similar to that of a semiconductor material, such as for example, molybdenum or tungsten. A silver layer 3 is joined to disc 2, for example, by an alloying process. When such a supply electrode as 10 is placed onto the electrode of a semiconductor body, the boundary between the supply electrode and the electrode experiences virtually no mechanical stresses in the direction of the main surface of the semiconductor body. However, the disc 2 is a relatively high thermal resistance for dissipating heat from a semiconductor component.

Figure 2:
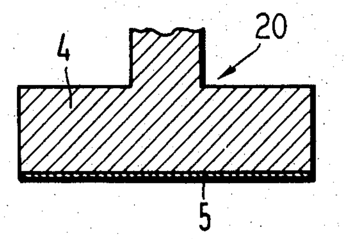
FIG. 2 is an elevated cross-sectional partial view of an embodiment of the invention.

FIG. 2 shows a first exemplary embodiment 20 of a supply electrode constructed in accordance with the principles of the invention. The supply electrode 20 is composed of a part 4 formed of a metal which is both electrically and thermally a good conductor, such as for example, copper or aluminum. A layer 5 composed of a silver material, such as silver or a silver alloy, is permanently attached to the undersurface of part 4. The thickness of the silver layer 5 is at least 50 and is preferably about 200$\mu$. Conventional fine silver, i.e., silver having a degree of purity of at least 98 percent or an alloy comprised primarily of silver, are the preferred silver materials for layer 5. The silver layer may be soldered or rolled onto part 4, either under a protective gas (i.e. $N_2$) or in a vacuum. Rolling of noble metals onto less noble metals is known and further details thereof are not required for workers in this art. Generally, rolling merely involves the application of high pressure, with the copper and the silver being joined to one another by a type of diffusion soldering. A silver foil of desired thickness is preferably rolled onto the copper or aluminum surface in a protective gas atmosphere before an oxide layer can form on the copper or aluminum surface. In this manner, it is possible to maintain the electrical and thermal contact resistance between the copper or aluminum surface and the silver layer substantially constant, even during operation. The silver layer 5 is then surface roughened, for example, by sandblasting or lapping. The amount of surface roughness is controlled so as to range between 2 to 10$\mu$. The layer 5 may also be applied by spraying in accordance with known metal spraying processes, preferably in a vacuum onto part 4. Generally, this comprises melting silver in an arc and impinging a powerful gas jet through the arc and onto the molten silver so that silver droplets are directed against the desired surface of a supply electrode. The silver is thus sprayed on the copper or aluminum surface. The desired roughness may be achieved by the spraying process itself so that further mechanical treatment may be dispensed with.

Figure 3:
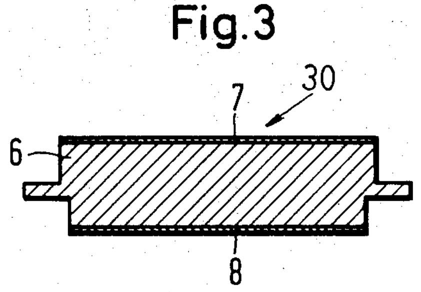
FIG. 3 is a similar view of another embodiment of the invention.

FIG. 3 illustrates a second exemplary embodiment 30 of a supply electrode constructed in accordance with the principles of the invention and useful with disc-shaped semiconductor components. The supply electrode 30 is composed of a part 6 formed of a metal which is both electrically and thermally a good conductor, such as copper or aluminum. Silver layers 7 and 8 are respectively provided in contact with the upper and lower surfaces of part 6. The layers 7 and 8 may, as in the exemplary embodiment 20, be permanently attached to part 6 by soldering, rolling, welding or spraying. The thickness and surface roughness of at least layer 8 (i.e., the pressure-contacting surface) and, if desired, of layer 7, are within the parameters set forth above in discussing layer 5 of FIG. 2.

Figure 4:
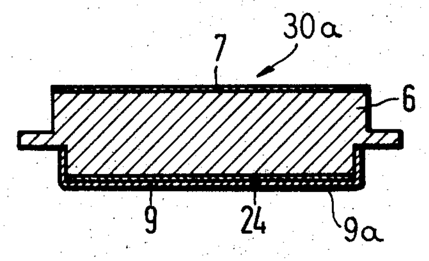
FIG. 4 is a similar view of yet another embodiment of the invention.

FIG. 4 illustrates a third exemplary embodiment 30*a* of a supply electrode constructed in accordance with the principles of the invention and useful with disc-shaped semiconductor components. The supply electrode 30*a* is similar to supply electrode 30 and like parts have been disignated with like reference numerals. Supply electrode 30*a* primarily differs from that shown at FIG. 3 in that the pressure-contacting silver layer is in the form of a cap-like member 9 which embraces at least some side wall or periphery areas of part 6. The member 9 is of a minimum thickness of 50$\mu$ and is preferably about 200$\mu$ thick. At least the pressure-contacting surface 9*a* is provided with a surface roughness ranging from 2 to 10$\mu$, similarly to that discussed in conjunction with the earlier embodiments.

In forms of this embodiment where part 6 is composed of copper, oxidation of its undersurface may be avoided, for example, by applying a thin galvanie silver layer 24.

Instead of cap-like member 9, a suitably roughened silver foil having a thickness of at least 50$\mu$ may be loosely inserted between adjacent surfaces of a supply electrode and an electrode on the semiconductor body. However, a silver cap-like member arranged to embrace at least a periphery of a supply electrode is preferred since it provides for an automatic centering of the silver pressure-contact surface onto the semiconductor body.

The cap-lke member shown at FIG. 4 may also be used with the supply electrode 20 of FIG. 2. Similarly, a silver foil may also be used with the supply electrode 20.

Figure 5:
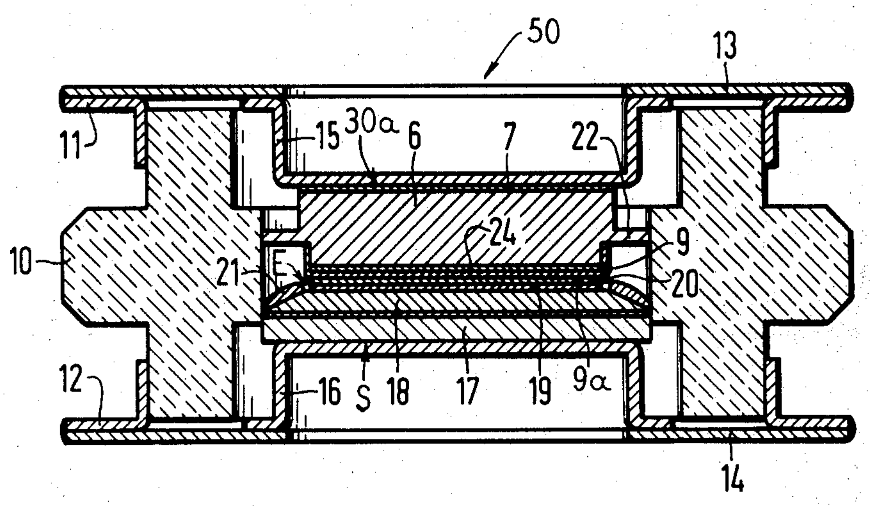
FIG. 5 is an elevated cross-sectional view of a disc-shaped semiconductor component including a supply electrode constructed in accordance with the principles of the invention.

FIG. 5 illustrates a disc-shaped semiconductor component 50, which incorporates the supply electrode 30*a* of FIG. 4. The housing of the semiconductor component 50 includes an insulating ring 10 composed of, for example, a ceramic. The housing also includes two L-shaped metal rings 11 and 12 connected to the outer surfaces of ring 10, such as by soldering. Metal rings 13 and 14, composed of, for example, copper, are attached to the L-shaped rings 11 and 12 as shown. The rings 13 and 14 are provided with a central opening and bowl-shaped parts 15 and 16, also composed of copper, are inserted into the opening and joined to rings 13 and 14 in a gas-impermeable manner, for example, by soldering, gluing or welding. A semiconductor element S, which includes at least one outer diffusion doped zone is positioned on an upfacing surface of the lower bowl-shaped part 16. The semiconductor element S is composed of a carrier plate 17 formed of a metal which has a coefficient of thermal expansion similar to that of a select semiconductor material, and for example, may be composed of molybdenum. A semiconductor body 18, composed, for example, of silicon, is connected to plate 17, as by alloying. The semiconductor body 18 is provided with an electrode E on an upfacing surface thereof. The electrode E is composed of two layers 19 and 20. The layer 19 is composed of aluminum and has a thickness of about 10 to 20$\mu$. The layer 20 is composed of silver and has a thickness of about 1 to 2$\mu$. The aluminum layer 19 may be vaporized onto the semiconductor body 18 in a vacuum and the silver layer 20 may then be vaporized onto the aluminum layer 19 in the same vacuum and then the entire subassembly may be sintered at about 450° C. to achieve a silver-plated aluminum electrode. In this manner, any oxidation of aluminum is avoided. A supply electrode 30*a* comprised of parts 6, 7, 9 and 24 (as discussed at FIG. 4) is arranged so that its pressure-contacting surface 9*a* is in direct contact with the upper surface of electrode E. The supply electrode 30*a* is also provided with a ring 22 which allows the supply electrode 30*a* to be easily centered within the housing of semiconductor component 50. The ring 22 generally is of a size to fit within the insulating ring 10 without play. In order to protect a pn-junction which may extend to the edges of the semiconductor body 18, a further protective layer 21, for example, composed of silicon rubber, may be provided along such edges.

Semiconductor components constructed in accordance with the principles of the invention retain their properties in terms of forward voltages under all operating conditions, i.e., both under continuous loads as well as under frequently changing loads. In the event of a frequently changing load, the roughened silver-pressure contact surface, such as 9*a* of FIGS. 4 or 5, may be partially smoothed so that the rubbed-off silver particles settle in the recesses of adjoining surfaces and function as a lubricant. Under a continuous load, the silver pressure-contacting surfaces of the electrodes, for example, contacting surfaces of cap-like member 9 and of electrode layer 20, do not, surprisingly, coalesce.

Although particular embodiments of the invention have been described and illustrated herein, it is recognized that modifications and variations may readily occur to those skilled in the art and consequently it is intended that the claims be interpreted to cover such modifications and equivalents.

We claim as our invention:

1. A semiconductor component comprised of;

a semiconductor body having at least one outer zone which is doped by diffusion, an electrode vaporized on said body and being composed of silver-plated aluminum, and a supply electrode for pressure-contacting said electrode and being composed of a metal having a coefficient of thermal expansion different from that of said semiconductor body, said supply electrode having a pressure-contacting surface defined by a layer composed of a silver material, said layer having a thickness of at least 50$\mu$ and a surface roughness ranging between 2 to 10$\mu$, said pressure-contacting surface being in direct contact with said silver-plated aluminum electrode.

2. A semiconductor component as defined in claim 1 wherein said layer is permanently joined to the supply electrode.

3. A semiconductor component as defined in claim 2 wherein said layer is rolled onto said supply electrode.

4. A semiconductor component as defined in claim 2 wherein said layer is soldered to said supply electrode.

5. A semiconductor component as defined in claim 2 wherein said layer is welded to said supply electrode.

6. A semiconductor component as defined in claim 2 wherein said layer is sprayed onto said supply electrode.

7. A semiconductor component as defined in claim 1 wherein said layer is a foil loosely positioned between the electrode and said supply electrode.

8. A semiconductor as defined in claim 1 wherein said layer is a portion of a cap-like member loosely embracing at least a part of the periphery of said supply electrode.

9. A semiconductor component as defined in claim 1 wherein said layer is composed of substantially pure silver and said supply electrode is composed of silver-plated copper.

10. In a semiconductor component including a semiconductor body having at least one outer diffusion doped zone and a two-layer electrode thereon composed of an aluminum layer in direct contact with said semiconductor body and a silver layer in direct contact with said aluminum layer, the improvement comprising:

a supply electrode composed of a metal having a coefficient of thermal expansion different from that of said semiconductor body, said metal being selected from the group consisting of aluminum and copper; and a layer on said supply electrode defining a pressure-contacting surface in direct contact with said two-layer electrode, said layer being composed of a silver material and having a thickness in the range of 50 to 200$\mu$ and a surface roughness ranging between 2 to 10$\mu$.

11. In a semiconductor component as defined in claim 10 wherein said supply electrode is composed of copper and a relatively thin silver layer is provided on a surface thereof which supports said layer defining the pressure-contacting surface.

* * * * *